United States Patent
Oyama et al.

(10) Patent No.: US 7,543,307 B2
(45) Date of Patent: Jun. 2, 2009

(54) INTERFACE METHOD AND DEVICE HAVING INTERFACE FOR CIRCUIT COMPRISING LOGICAL OPERATION ELEMENT

(75) Inventors: Hiroshi Oyama, Niwa-gun (JP); Hiroaki Takada, Nagoya (JP); Morio Fukushima, Niwa-gun (JP)

(73) Assignee: Okuma Corporation, Niwa-gun (JP)

(*) Notice: Subject to any disclaimer, the term of this patent is extended or adjusted under 35 U.S.C. 154(b) by 716 days.

(21) Appl. No.: 10/620,615

(22) Filed: Jul. 17, 2003

(65) Prior Publication Data

US 2004/0019618 A1    Jan. 29, 2004

(30) Foreign Application Priority Data

Jul. 22, 2002   (JP)   ............... 2002-213005

(51) Int. Cl.
G06F 3/00      (2006.01)
G06F 9/44      (2006.01)
G06F 9/46      (2006.01)
G06F 13/00     (2006.01)

(52) U.S. Cl. ...................... 719/328; 719/313
(58) Field of Classification Search ................. 719/315, 719/316, 313, 328
See application file for complete search history.

(56) References Cited

U.S. PATENT DOCUMENTS

| | | | |
|---|---|---|---|
| 6,023,579 A * | 2/2000 | Hellgren et al. ............. | 717/108 |
| 6,308,225 B1 * | 10/2001 | Schofield .................... | 719/316 |
| 6,347,342 B1 * | 2/2002 | Marcos et al. .............. | 719/315 |
| 6,532,471 B1 * | 3/2003 | Ku et al. ..................... | 707/102 |
| 6,640,255 B1 * | 10/2003 | Snyder et al. ............... | 719/315 |
| 7,058,956 B1 * | 6/2006 | Harjanto ..................... | 719/316 |
| 7,171,475 B2 * | 1/2007 | Weisman et al. ............ | 709/227 |

OTHER PUBLICATIONS

Silberschatz et al. "Applied Operating System Concepts," First Edition, John Wiley & Sons, Inc., 2000; pp. 401-412, 469-477.*
Silberschatz et al. "Applied Operating System Concepts," First Edition, John Wiley & Sons, Inc., 2000; pp. 501-518, 567-574.*
Umar, Amjad, "Object-Oriented Client/Server Internet Environments," Prentice Hall PTR, 1997; pp. 99-143, 301-357.*
Matsubara et al., "WWW Brings the World of Distributed Object," Nikkei Byte, Japan, Nikkei BP, Jul. 2, 1996, No. 154, pp. 204-221.

* cited by examiner

*Primary Examiner*—Meng-Ai An
*Assistant Examiner*—Nathan Price
(74) *Attorney, Agent, or Firm*—Oliff & Berridge, PLC (57) ABSTRACT

An interface is defined using an interface definition language, some portion of which is common to an interface definition language directed to a software object and a means for defining a function name, an argument, and a return value for each function. A server interface for realizing the interface comprises means for inputting for identifying a function name described in the interface definition language, means for inputting and outputting an argument, and means for outputting a return value.

13 Claims, 12 Drawing Sheets

```
interface randomGenerator{
    void  setSeed( in double seed );
    double getRandom();
};
```

Fig. 3

```
/* part common to IDL interface */
/* status register value */
#define   Executing    1
#define   Finished     2
#define   Requesting   3

/* function for accessing register */
void     putFunctionID( FID );
void     putDoubleArg( double );
double   getDoubleReturn();
int      getStatus();

/* randomGenerator unique part */
/* definition of function identification value */
#define  FID_setSeed    1
#define  FID_getRandom  2

/* proto-type declaration in C-language function, corresponding to function */
void     setSeed( double seed );
double   getRandom()
```

Fig. 4

```
void setSeed( double seed )
{
    putFunctionID( FID_setSeed );
    putDoubleArg( seed );
} double getRandom( )
{
    putFunctionID( FID_getRandom );
    while( getStatus() != Finished )
        ;
    return getDoubleReturn( );
}
```

```
interface piCalculator{
    void  setCount( in int count );
    double getPi();
};
```

```
/* part common to IDL interface */
/* status register value */
#define   Waiting     0
#define   Executing   1
#define   Finished    2
#define   Requesting  3

/* function for accessing register */
FID      getFunctionID( );
double   getDoubleArg();
double   putDoubleReturn( double );
int      getStatus();

/* randomGenerator unique part */
/* definition of function identification value */
#define   FID_setSeed    1
#define   FID_getRandom  2

/* proto-type declaration in C-language function, corresponding to function */
void     setSeed( double seed );
double   getRandom()
```

Fig. 13

```
main()
{
    while(1){
        while( getStatus() != Requesting )
            ;
        switch( getFunctionID() ){
            case FID_setSeed:
                setSeed( getDoubleArg() );
                break;
            case FID_getRandom:
                putDoubleReturn( getRandom() );
                break;
        }
    }
}
```

INTERFACE METHOD AND DEVICE HAVING INTERFACE FOR CIRCUIT COMPRISING LOGICAL OPERATION ELEMENT

BACKGROUND OF THE INVENTION

1. Field of the Invention

The present invention relates to an interface method and device having an interface for use with a logical circuit which comprises a logical operation element including a flip-flap and a variety of gates such as an AND gate, an OR gate or a NOT gate.

2. Description of the Related Art

According to a conventional interface method employed for interfacing a microprocessor and a peripheral LSI, a status value is read out and/or execution of predetermined processing is controlled via a register referred to as a status register or a command register. Therefore, programmers who design a program for controlling the peripheral LSI must be familiar with the meanings of and correlation between the respective registers in order to understand the interface of the peripheral LSI, and are required to mind the procedure of setting the registers in preparation of programs.

Recent peripheral LSIs can accommodate more complicated functions, and accordingly are equipped with a larger number of status and/or command registers. This makes it difficult for programmers to become familiar with the meanings of or correlation between the respective registers. This difficulty potentially increases program errors and causes a longer error determination time. Moreover, due to the complexity of functions, determination can be hardly made as to whether such a function is realized by means of software or hardware. Such a background leads to a need of a method and/or device which can facilitate exchange between software and hardware.

Meanwhile, according to one method that has recently become common, an interface with a software object is defined using IDL(interface definition language). Examples of such a language may include an IDL of CORBA by OMG (Object Management Group) and an IDL by COM(Component Object Model) by Microsoft. These languages, however, are directed to only software objects and cannot accommodate hardware objects, or a device.

In view of the above, the applicant of the present application conceived an idea that, if an interface with a hardware can be defined using an IDL, hardware and software could be treated uniformly without discrimination. This could enable, for example, ready exchanges between software and hardware, thus reducing the burden on a programmer. Moreover, this could also enable, for example, ready definition of a method for interfacing with a software, thus also reducing the burden on a hardware designer.

The present invention has been conceived in view of the above and advantageously offers an interface method for a logical circuit and a device having an interface. According to the method or device of the present invention, interfacing with a device, such as a peripheral LSI, which comprises a logical circuit can be improved and the burden on a programmer in understanding registers and their correlation can be reduced. Moreover, the method or device of the present invention allows uniform treatment of a software object and a hardware object, thus enabling ready exchange between these objects.

SUMMARY OF THE INVENTION

In order to produce the above described advantages, according to one aspect of the present invention, there is provided an interface method for a logical circuit comprising a logical operation element, the method comprising the step of defining an interface, using an interface definition language which is partly common to an interface definition language directed to a software object and has means for defining a function name, an argument, and a return value for each functiom and providing at least means for inputting for identifying a function name defined by the interface definition language for a server interface circuit in order to realize the interface among the means for inputting for identifying a function name defined by the interface definition language, means for inputting and outputting an argument, and means for outputting a return value.

According to another aspect of the present invention, there is provided an interface method for a logical circuit comprising a logical operation element, the method comprising the step of defining an interface, using an interface definition language which is partly common to an interface definition language directed to a software object and has means for defining a function name, an argument, and a return value for each function; and providing at least means for outputting for identifying a function name defined by the interface definition language for a client interface circuit in order to realize the interface among the means for outputting for identifying a function name defined by the interface definition language. means for inputting and outputting an argument, and means for inputting a return value. According to still another aspect of the present invention, there is provided an interface method for a logical circuit comprising a logical operation element, said method comprising the step of defining an interface, using an interface definition language which is partly common to an interface definition language directed to a software object and has means for defining a function name, an argument, and a return value for each function, wherein the logical circuit comprises a server logical circuit, as a server interface circuit for realizing the interface, having at least means for inputting for identifying a function name defined by the interface definition language among the means for inputting for identifying a function name defined by the interface definition language, means for inputting and outputting an argument. and means for outputting a return value, and a client logical circuit, as a client interface circuit for realizing the interface, having at least means for outputting for identifying a function name defined by the interface definition language among the means for outputting for identifying a function name defined by the interface definition language, means for inputting and outputting an argument, and means for inputting a return value, and data can be transferred from the means for outputting for identifying a function name of the client logical circuit to the means for inputting for identifying a function name of the server logical circuit, when the server logical circuit and the client logical circuit have the means for inputting and outputting an argument, data can be transferred between the means for inputting and outputting an argument of the server logical circuit and means for inputting and outputting an argument of the client logical circuit, and when the server logical circuit and the client logical circuit have at least of the means for outputting a return value and the means for inputting a return value, data can be transferred from the means for outputting a return value to the means for inputting a return value.

According to yet another aspect of the present invention, there is provided a device having an interface and a logical circuit comprising a logical operation element, which defines an interface, using an interface definition language which is partly common to an interface definition language directed to a software object and has means for defining a function name, an argument, and a return value for each function, wherein a server interface circuit for realizing the interface comprises means for inputting for identifying a function name defined by the interface definition language among the means for inputting for identifying a function name defined by the interface definition language, means for inputting and outputting an argument, and means for outputting a return value.

According to yet another aspect of the present invention, there is provided a device having an interface and a logical circuit, which defines an interface, using an interface definition language which is partly common to an interface definition language directed to a software object and has means for defining a function name, an argument, and a return value for each function, wherein a client interface circuit for realizing the comprises means for outputting for identifying a function name defined by the interface definition language among the means for outputting for identifying a function name defined by the interface definition language, means for inputting and outputting an argument, and means for inputting a return value.

DESCRIPTION OF THE PREFERRED EMBODIMENTS

In the following, embodiments of the present invention will be described with reference to the accompanied drawings.

Figure 1:
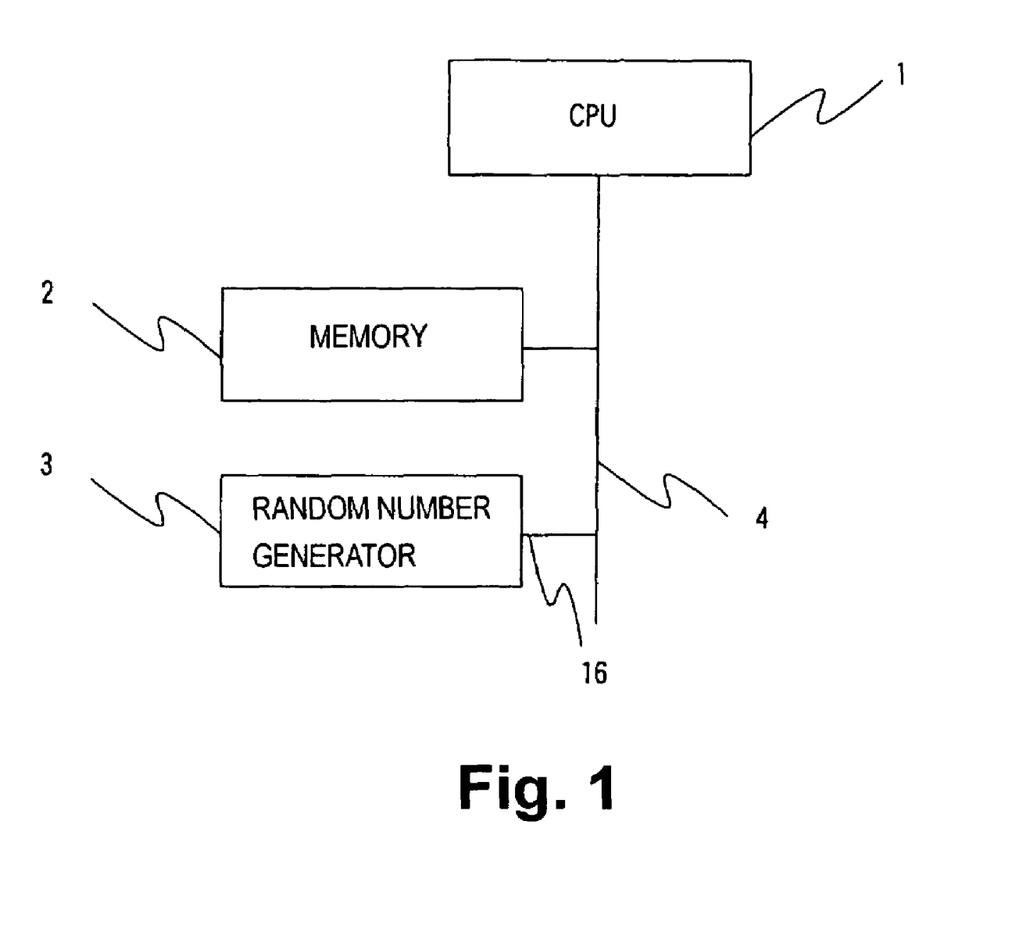
FIG. 1 is a diagram showing a structure of a computer system of the present invention.

FIG. 1 is a diagram showing a structure of a computer system of the present invention. This system comprises a CPU 1, a memory 2, and a random number generator 3. The memory 2 and the random number generator 3 are connected to the CPU 1 via a system bus 4. The CPU 1 interprets and processes a program stored in the memory 2.

Figure 2:
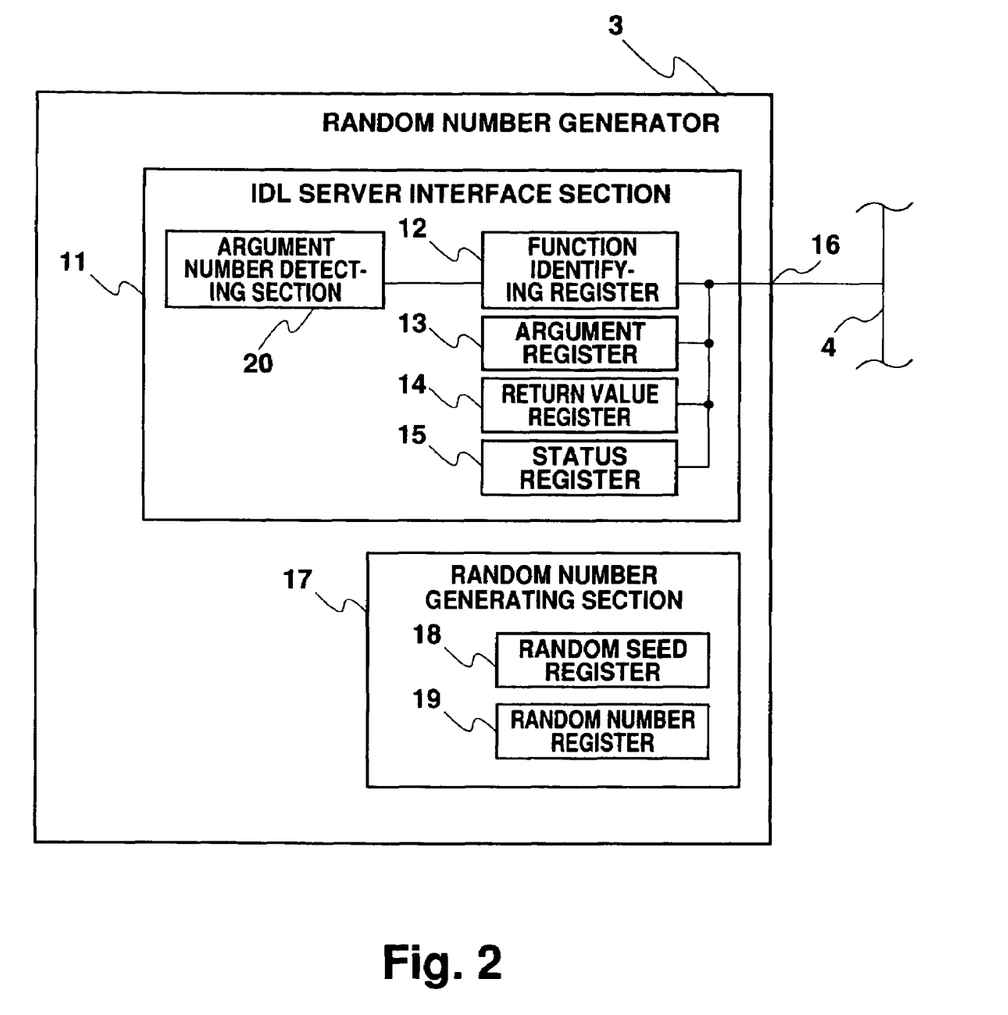
FIG. 2 is a block diagram showing a structure of a random number generator.

FIG. 2 is a block diagram showing a structure of the random number generator 3. The random number generator 3 has an IDL server interface section 11, which comprises a function identifying register 12, an argument register 13, a return value register 14, and a status register 15. The IDL server interface section 11 is connected to the system bus 4 via an external terminal 16. It should be noted that although a controller for controlling data exchange between the system bus 4 and the respective registers 12 through 15 is not shown in FIG. 2, the data is exchanged via an address bus or a control bus contained in the system bus 4.

Figure 3:
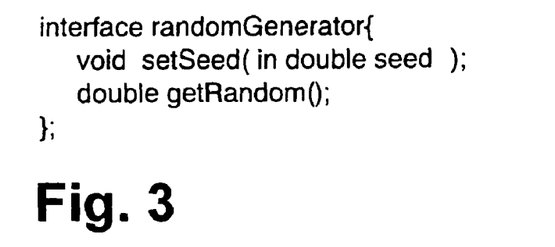
FIG. 3 is a diagram explaining an interface definition of a random number generator using an interface definition language, or an IDL.

FIG. 3 shows an example of a definition of an interface written in an IDL. This definition, as is common to an IDL of CORBA described above, specifies an interface name, a function name, and an argument and a return value for each function. The example of FIG. 3 defines an interface called "randomGenerator" of a random number generator 3, and specifies a function for setting a random seed (function name: setSeed) and a function for obtaining a generated random number (function name: get Random). Function "setSeed" is for supplying a seed in a double precision real number as an input argument, and function "getRandom" is for returning a random number generated as a return value, in the form of a double precision real number.

Figure 4:
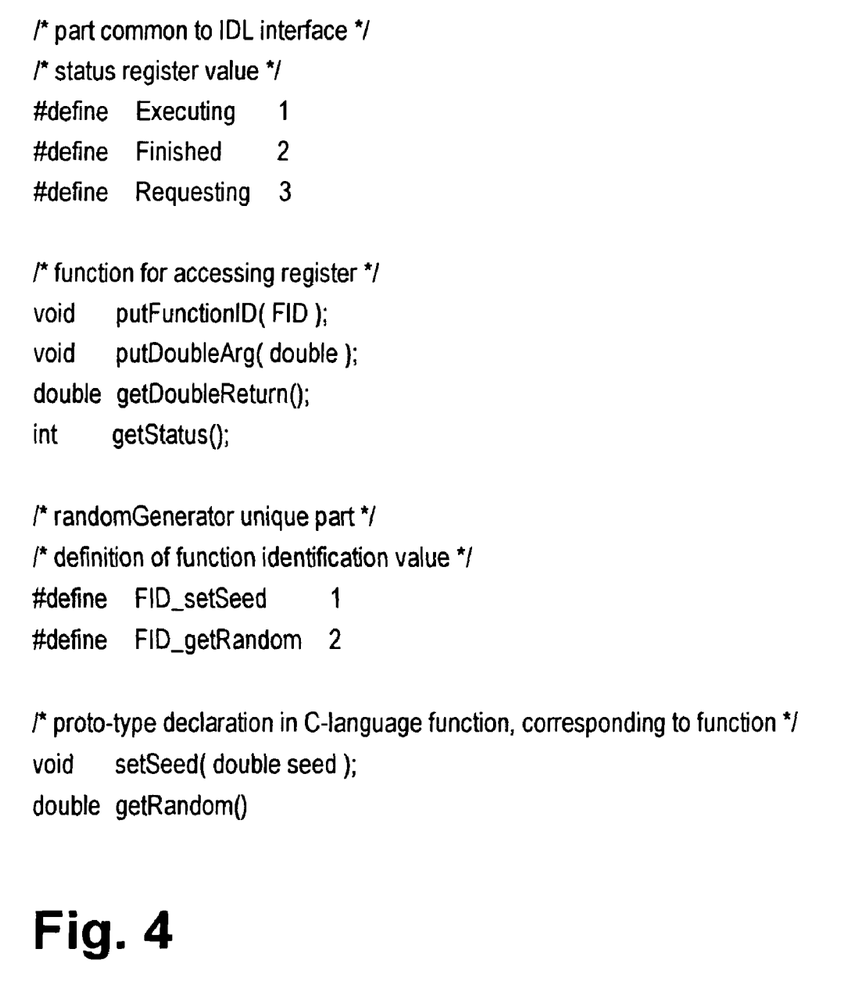
FIG. 4 is a diagram explaining a header file corresponding to a program of FIG. 5.
Figure 5:
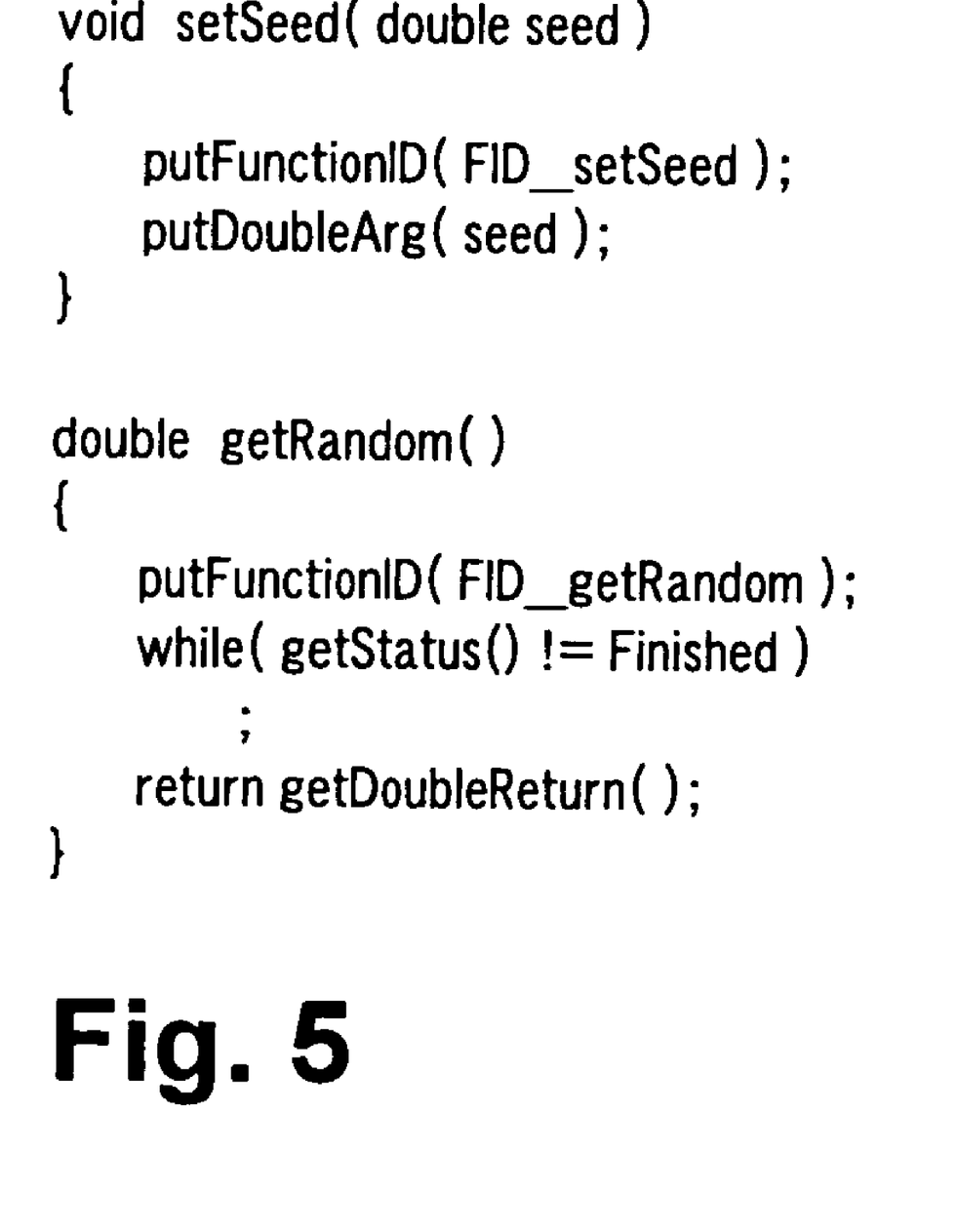
FIG. 5 is a diagram explaining a program for directly causing a random number generator to operate.

FIGS. 4 and 5 respectively show a header file and a program written in C-language based on the interface definition of FIG. 3 to operate a device having an interface of the present invention by the CPU 1. Generally, such a header file and a program can be created using a program known as an "IDL compiler" by converting an interface definition according to a given rule. While an IDL compiler such as CORBA converts the interface definition into a header file or a program written in C or C++ language to creates communication data based on the interface definition, in this embodiment, a program to set or refer to registers of the IDL server interface section 11 of the random number generator 3 written in C-language is generated. Such a program is generally referred to as a stub or a proxi.

The program of FIG. 5 specifies functions "setSeed" and "getRandom" respectively corresponding to "setSeed" and "getRandom" included in the interface definition. These functions will next be described in the context of an operation of the random number generator 3 while referring to the structure of FIGS. 1 and 2, as the method and device of the present invention are achieved through cooperation by two or more sections.

Specifically, the CPU 1 reads out a program stored in the memory 2, and then calls a function "setSeed" from the read program. Based on a program relevant to the function "setSeed", the CPU 1 writes "FID_setSeed" which is a value to identify functions into the function identifying register 12 of the random number generator 3. The CPU 1 also writes an argument "seed" into the argument register 13 as a double precision real number, to thereby complete the processing. It should be noted that that the constant "FID_setSeed" is defined by the header file of FIG. 4, as other constants such as "FID_getRandom" and "Finished" are similarly defined by a header file.

Then, the IDL server interface section 11 of the random number generator 3 confirms receipt of all arguments relevant to the function "setSeed" and immediate thereafter begins its operation. In this example, it stores a random seed in the random seed register 18 of the random number generating section 17.

Subsequently, function "getRandom" is called, and a function identification value "FID_getRandom" is written into the function identifying register 12 of the random number generator 3. Because the function "getRandom" contains no argument, the IDL server interface section 11 immediately causes the random number generating section 17 to generate a random number, and writes the generated random number into the return value register 14.

During processing for the function "getRandom", a value in the status register 15 is continuously read outby calling function "getStatus" until any value is written into the return value register 14 and the processing for the function "getRandom" is repeated until a value corresponding to "Finished" is written in the return value register 14.

Figure 7:
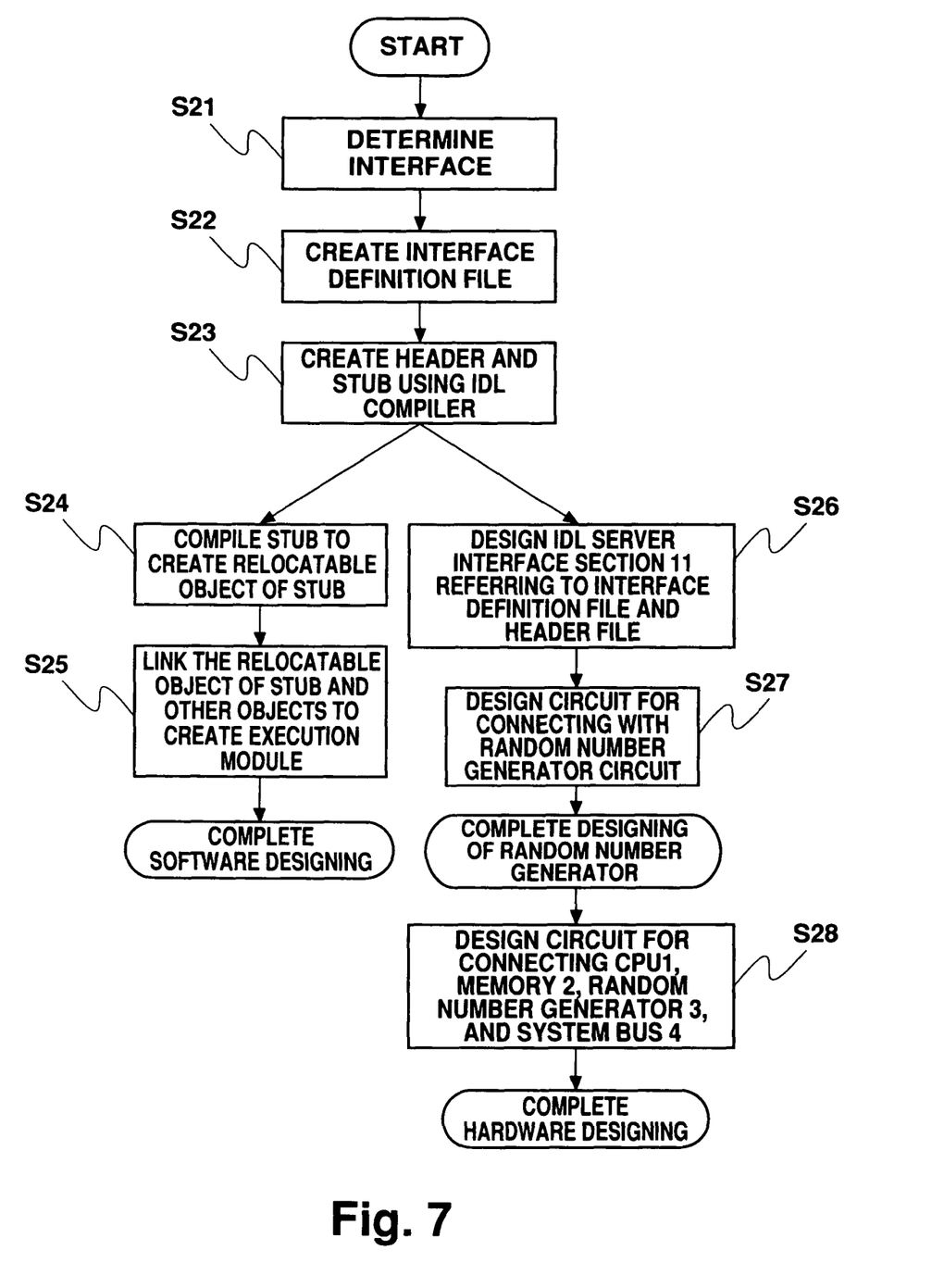
FIG. 7 is a flowchart of a designing operation.

The above is an outline of the overall operation of a computer system incorporating a device of the present invention. The computer system shown in FIG. 1 is designed as explained below and shown in the flowchart of FIG. 7, in which each step is represented as "S" followed by a corresponding number.

Initially, an interface is determined (S21) by listing all functions necessary for the interface, and specifying a function name, an argument, and a return value for each function. Then, an interface definition file is created based on the interface defined at S21 (S22), and the resultant interface definition file is supplied to an IDL compiler to create a header file, such as is shown in FIG. 4, and a stub, such as is shown in FIG. 5 (S23).

The operation flow then branches into software designing and hardware designing. For software designing, the stub is complied by a compiler to thereby create a relocatable object (S24). An execution module is created by linking the resultant relocatable object to relocatable objects of different functions (S25). Then, the software design process is completed.

For hardware designing, on the other hand, a hardware designer designs an IDL server interface section 11 with reference to the interface definition file of FIG. 3 and the header file of FIG. 4 (S26). The content of the interface definition file and header file to be referred to here will be described below in detail in the context of an operation of the IDL server interface section 11. Then, a circuit for connecting a circuit of the random number generating section 17 and the IDL server interface section 11 is designed (S27) to thereby complete designing of the random number generating device 3. Thereafter, a circuit for connecting the CPU 1, the memory 2, the random number generator 3, and the system bus 4 are designed (S28) to thereby complete hardware designing.

Figure 6:
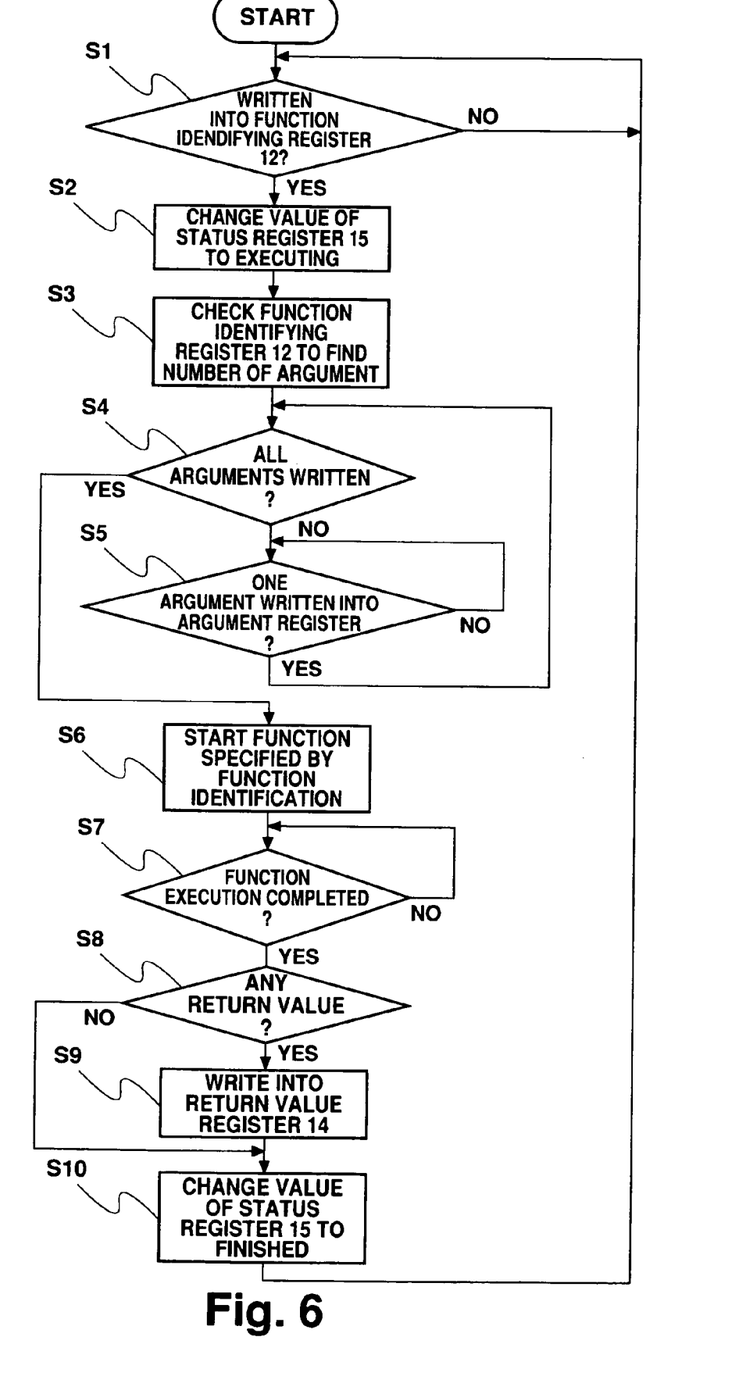
FIG. 6 is a flowchart of an operation of an IDL server interface section.

Functions of the IDL server interface section 11 will next be described in detail with reference to the flowchart of FIG. 6 as these are essence of the present invention.

Specifically, the IDL server interface section 11 determines whether or not any value is written into the function identifying register 12 via an external terminal 16 (S1). A value to be written into the function identifying register 12 may be, for function "getSeed", a value indicative of "FID_setSeed" as defined by "#define" in the header file of FIG. 4, or "1" here. For function "getRandom", on the other hand, a value indicative of "FID_getRandom", or "2" here, may be written.

With any value written into the function identifying register 12, the value of the status register 15 is changed to a value "Executing", which means "in process" (S2), and the number of arguments is thereafter found out with reference to the content of the function identifying register 12 (S3) by an argument number detection section 20. The argument number detection section 20 is prepared in advance, with reference to the interface definition file of FIG. 3 and the header file of FIG. 4, so as to store correlation between a function identification and the number of relevant arguments.

Then, whether or not all arguments have been written into the argument register 13 is determined (S4). If there exists any argument which has yet to be written, the operation repeats from S4 (S5). If all arguments have already been written, or when there originally exists no argument, the function specified by the function identification is initiated (S6). A designer of the IDL server interface section makes a function identification coincident with a corresponding function, with reference to the header file of FIG. 4.

When processing relative to the function is completed (S7), whether or not there is any return value is determined (S8). If there is, the return value is written into the return value register 14 (S9). After finally changing the value of the status register 15 to "Finished", the above-described processing at S1 and subsequent steps is repeated.

It should be noted that, in the program of FIG. 5, although a "while" loop is used for waiting until a value of the status register is changed to "Finished", the interrupt which is caused by changing the value of the status register to "Finished" may be used for waiting. This arrangement can improve efficiency of use of the CPU 1.

The example of the embodiment of the present invention described above can be modified such that the number of arguments and/or the type of data are additionally determined. Also, in the case where no function in an interface definition contains an argument, the argument register 13, and thus S4 and S5 in FIG. 6, can be omitted. When no function contained in an interface definition returns a return value, the return value register 16, and thus S8 and S9 in FIG. 6, can be omitted.

Emulation of the operation of the random number generator 3 by software can be achieved merely by replacing the functions "setSeed" and "getRandom" of FIG. 5, which are hardware objects, by corresponding software objects. This is easily achievable as a hardware object can be readily replaced by a software object according to the present invention because an interface definition language used in the method and device of the present invention is partly common to an interface definition language directed to a software object.

Figure 8:
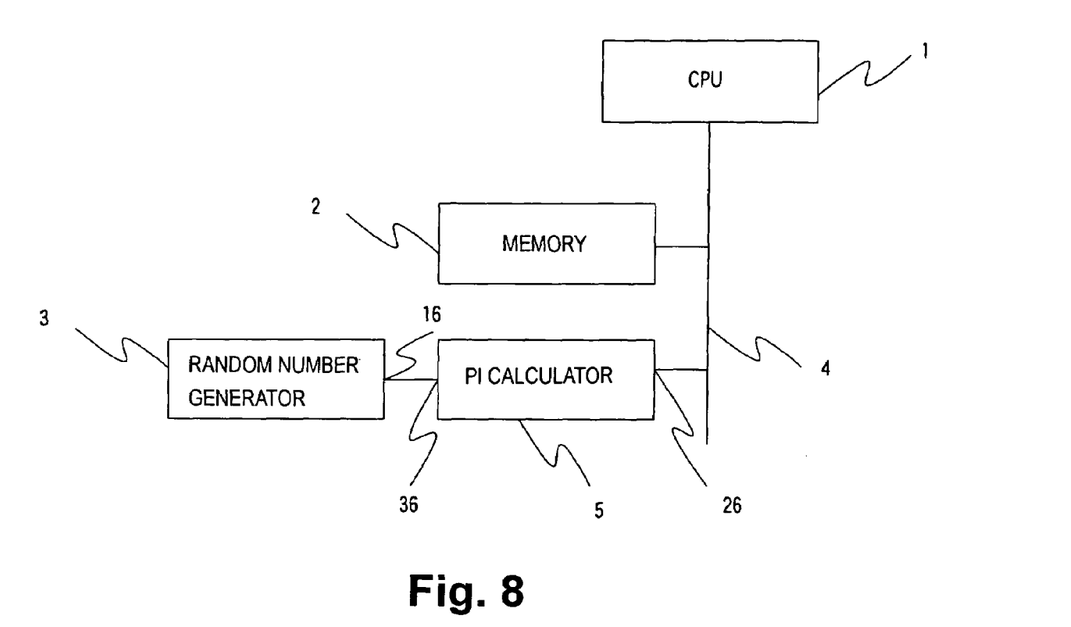
FIG. 8 is a block diagram showing a computer system incorporating a pi calculator.
Figure 9:
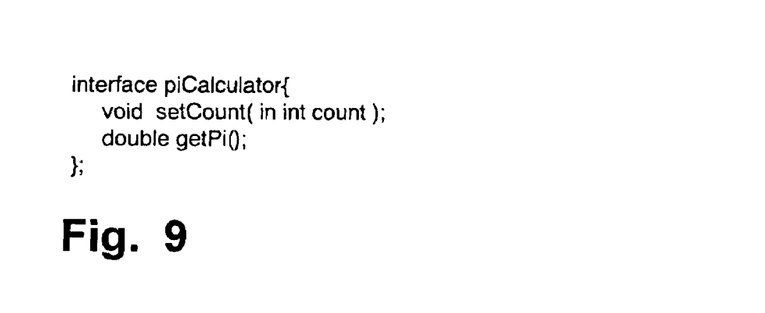
FIG. 9 is a diagram explaining an interface definition for use by a pi calculator.
Figure 10:
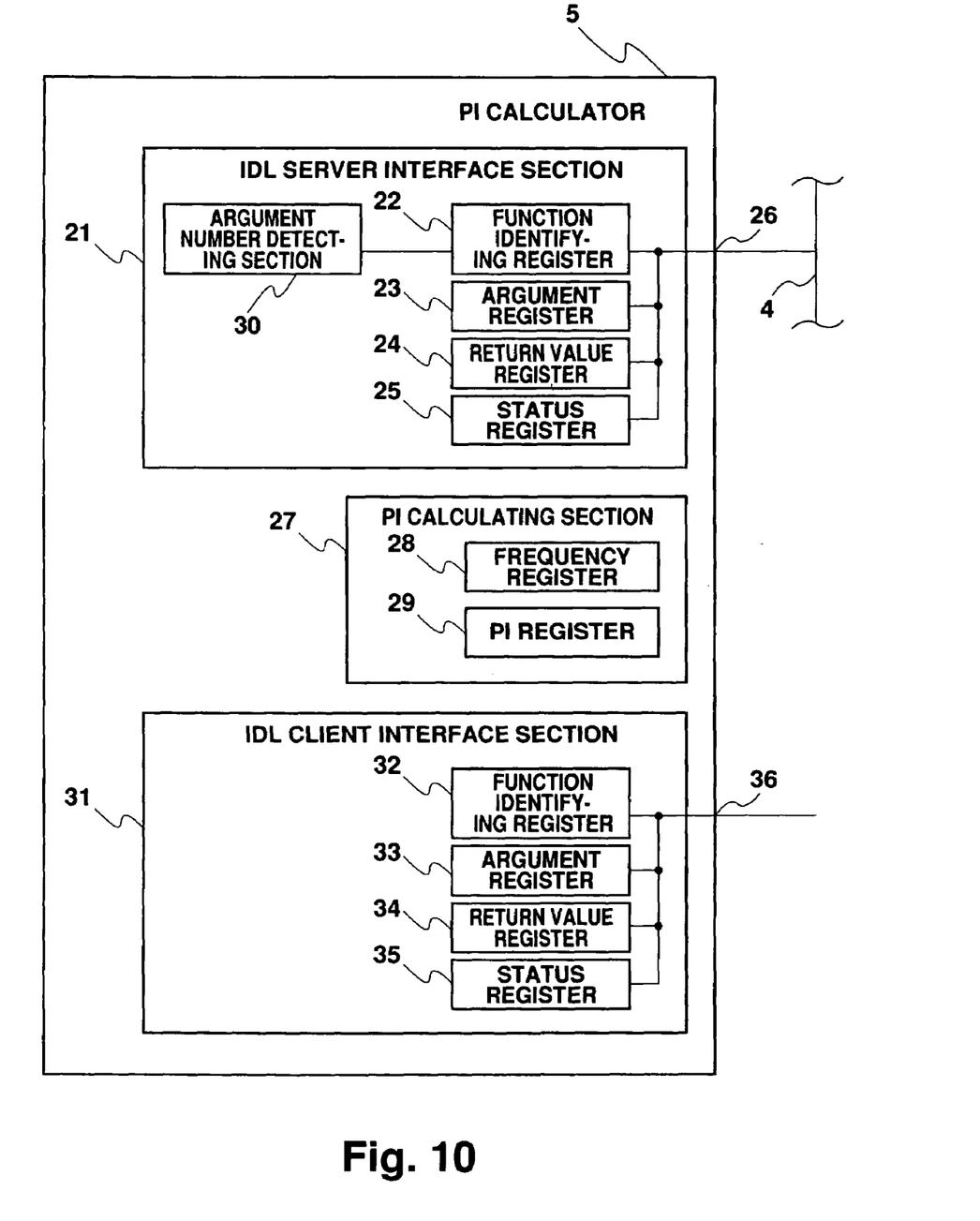
FIG. 10 is a block diagram showing a structure of a pi calculator which calculates a pi value.

FIG. 10 shows a structure of a pi calculator 5 for calculating a circuit rate, or a pi, using a random number generator 3 of FIG. 2 according to a Monte Carlo method. FIG. 9 shows an interface definition of the pi calculator. FIG. 8 shows a structure of a computer system incorporating the pi calculator 5.

The pi calculator 5 of FIG. 10 comprises an IDL server interface section 21, a pi calculating section 27, and an IDL client interface section 31. The IDL server interface section 21 is connected to the system bus 4 via an external terminal 26. The IDL client interface section 31 is connected to an external terminal 16 of the random number generator 3 via an external terminal 36.

Connection between the external terminal 36 and the external terminal 16 enables data transfer from the function identifying register 32 to the function identifying register 12, between the argument register 33 and the argument register 13, and from the return value register 14 to the return value register 34, whereby the pi calculator 5 can access the random number generator 3.

Figure 11:
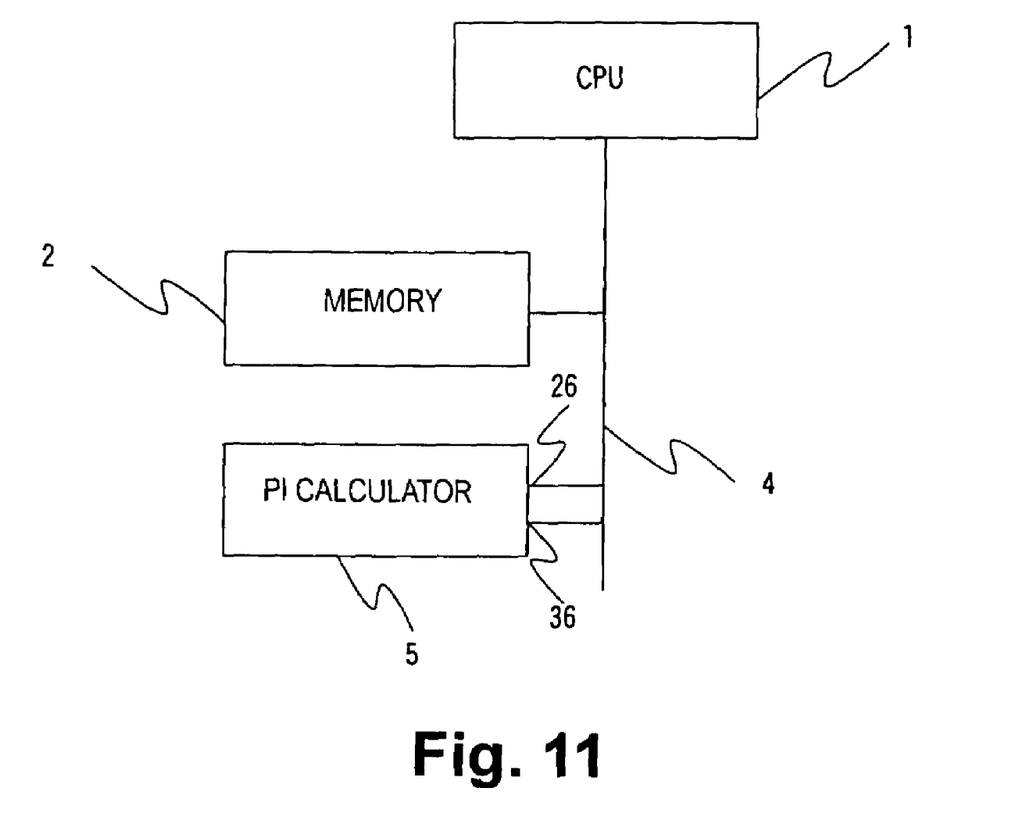
FIG. 11 is a block diagram showing a structure of a computer system modifies so as not to use a random number generator.

FIG. 11 shows a structure of the computer system of FIG. 8 which is modified so as not to use the random number generator 3. In the structure of FIG. 11, the IDL client interface section 31 of the pi calculator 5 is connected to the system bus 4 via the external terminal 36. In order to modify the structure of FIG. 8 to that of FIG. 11, the IDL client interface section 31 of the pi calculator 5 should be able to operate the IDL server interface section 11 of the random number generator 3, and values can be read and written via the CPU 1 with respect to the function identifying register 32, the argument register 33, the return value register 34, and the status register 35.

With the structure of FIG. 11, the CPU 1 should monitor a request from the IDL client interface section 31 of the pi calculator 5 and apply a function specified by a function identification.

Figure 12:
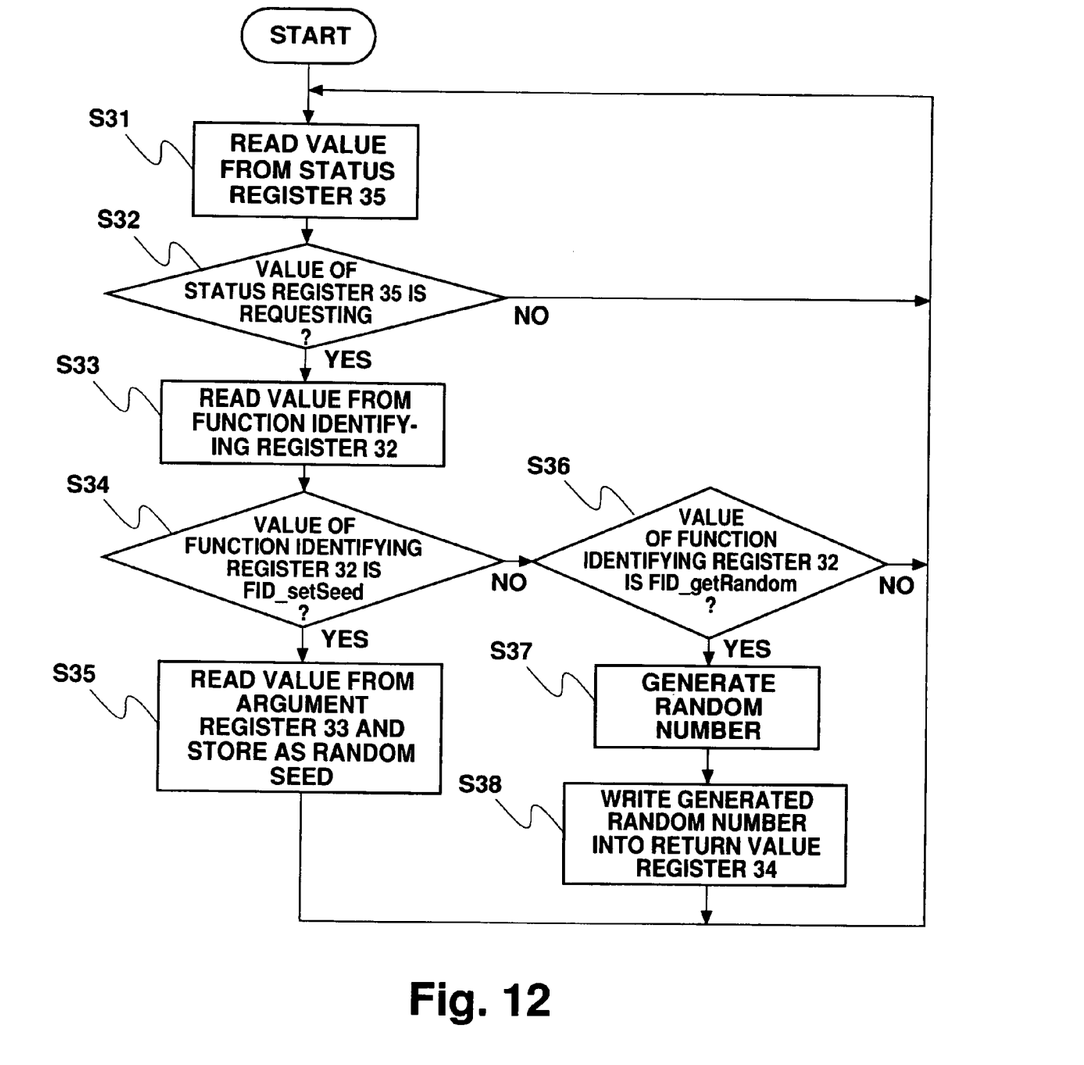
FIG. 12 is a flowchart of request monitoring and function execution by a CPU.

FIG. 12 is a flowchart of request monitoring and function execution by the CPU 1. Specifically, a value of the status register 35 of the IDL client interface section 31 of the pi calculator 5 is read out (S31). When the read value indicates "Requesting", it is determined that function execution has been requested (S32), and a value of the function identifying register 32 is then read out (S33). When the read value of the function identifying register 32 indicates "FID_setSeed" (S34), a value of the argument register 33 is further read out and stored as a random seed (S35). When the read value of the function identifying register 32 indicates "FID_getRando" (S36), a random number is generated (S37) and is written into the return value register 34 (S38). After S35 or S38, the operation flow returns to S31.

Execution of this program exclusively occupies the CPU 1. Therefore, the efficiency of the CPU1 may be improved by including an interrupt when the value of the status register 35 is changed to "Requesting".

Figure 13:
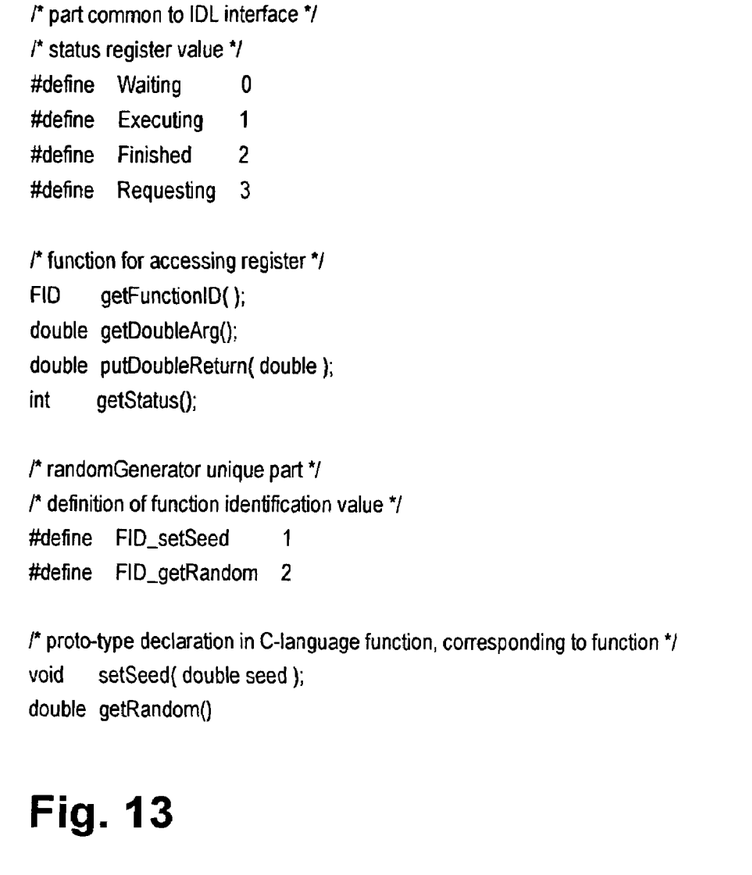
FIG. 13 is a diagram explaining a header file corresponding to a program of FIG. 14.
Figure 14:
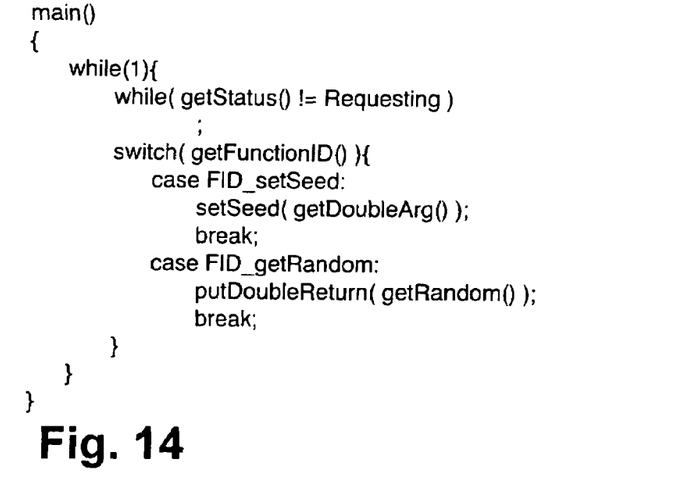
FIG. 14 is a diagram explaining a program describing the process of FIG. 12 in C-language.

FIGS. 13 and 14 respectively show a header file and a program both describing the process of FIG. 12 in C-language. The header file and the program, which can be uniquely obtained through conversion from an interface definition according to a given rule, can be created using a program called an IDL compiler, similar to the header file and a program file of FIGS. 4 and 5. A program such as is shown in FIG. 14 is referred to as a skeleton or a stub.

Figure 15:
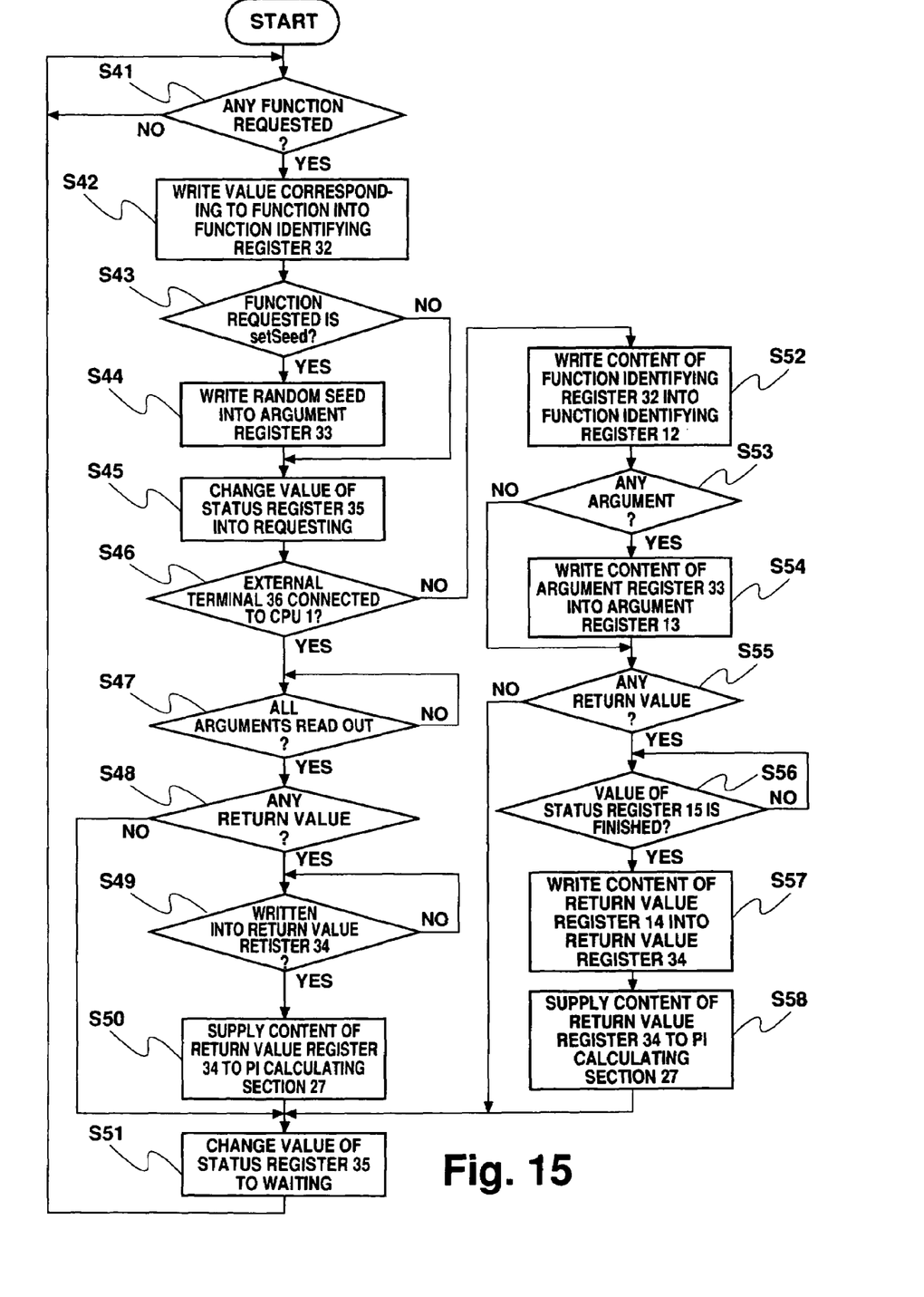
FIG. 15 is a flowchart of an operation of an IDL client interface section.

FIG. 15 is a flowchart of an operation of an IDL client interface section 31 having the above-described property.

Initially, whether or not the pi calculating section 27 has requested execution of a function is determined (S41). When it has, a corresponding function identification is written into the function identifying register 32 (S42). Specifically, a value indicative of either "FID_setSeed" or a "FID_getRandom" is written here. Then, whether or not the requested function is "setSeed" is determined (S43). If it is determined that the requested function is "setSeed", an argument is received from the pi calculator 27 and written into the argument register 33 (S44) before the value of the status register 35 is changed to "Requesting" (S45).

Hereafter, examples will be described in which different operations are executed according to whether or not the external terminal 36 of the pi calculator 5 is connected to the random number generator 3 or CPU 1.

Specifically, when the external terminal 36 is connected to the CPU 1, the CPU 1, which at this point must be operating according to the flowchart FIG. 12, reads out an argument from the argument register 33 at S35 with respect to the function identification "FID_setSeed". With respect to the function identification "FID_getRandom, there is no argument. Whether or not the CPU 11 has read out all arguments is determined (S47). A case where there originally exists no argument is treated as a case where all arguments have been read.

When all arguments have been read, it is then determined whether or not there exists any return value (S48). When it is determined that one or more return values exist, a return value is written into the return value register 34, and whether or not all return values have been written into the return value register 34 is determined (S49). When it is determined that all return values have been written into the return value register 34, the value written in the return value register 34 is supplied to the pi calculating section 27 as a random number (S50). This is the end of the processing involving the CPU 1, and the value of the status register 35 is changed to "waiting" (S51) before the operation flow returning to S41 to repeat the above.

Returning to S46, when the external terminal 36 is connected to the random number generator 3, the content of the function identifying register 32 is written into the function identifying register 12 of the IDL server interface section 11 of the random number generator 3 (S52). The random number generator 3 then must operate according the flowchart of FIG. 6 and, upon detection at S1 (FIG. 6) of the fact that data has been written into the function identifying register 12, applies processing at S2 and thereafter. It should be noted that that processing at S53 (FIG. 15), and thereafter by the IDL client interface section 31, is carried out in association with processing at S4 (FIG. 6), and thereafter by the IDL server interface section 11 of the random number generator 3.

Returning to FIG. 15, whether or not there exists any argument is determined (S53). Determination of whether or not there an argument exists is made in response to a function identification value indicative of "FID_setSeed". In this case, the content of the argument register 33 is written into the argument register 13 of the argument register 33 (S54).

Then, whether or not there is any return value is determined (S55). It is determined that there is a return value in response to a function identification value indictive of "FID_getRandom". When there is any return value, whether or not the value of the status register 15 of the random number generator 3 is "Finished" is determined (S56). When it is determined that the random number generator 3 is "Finished", a value of the return value register 14 of the random number generator 3 is written into the return value register 34 (S57), and the content of the return value register 34 is supplied to the pi calculating section 27 (S58). This is the end of the processing involving the random number generator 3; the value of the status register 35 is changed to "waiting" (S51) and the operation flow returns to S41 to repeat as necessary the process described above.

It should be noted that, although the present invention has been described while referring to the random number generator 3 and the pi calculator 5 as an example in the above embodiment, the present invention can be applied to various types of devices in which one or more of the random number generating section 17, the pi calculating section 27, and the interface definition (randomGenerator, piCalculator, etc.), are modified.

It should also be noted that, although the type and/or number of arguments is not ascertained in the above examples, such information may be determined in order to achieve more strict detection of errors in an interface program.

It should further be noted that, although only an example of an input argument is described in the above embodiments, an output argument and/or an input/output argument can be similarly applied, although, for an output argument, the direction of data transfer is reversed relative to the situation with an input argument.

It should still further be noted that, although an IDL of CORBA is referred to an interface describing language in the above embodiments, the interface describing language is not limited to an IDL of CORBA and any language which is at least partly common in an IDL directed to a software object and has a means for defining types of arguments and/or return values used in respective functions can be employed.

It should also be noted that, although discrimination of an instant object contained in the simplified program is not described in the above examples, the program preferably has a means for discriminating instant objects.

It should yet further be noted that, although the method and the device of the present invention can be most effectively used for interfacing between an integrated circuit and an external device or unit, the present invention can be similarly applied to interfacing between blocks within an integrated circuit or between logical circuits comprising two or more integrated circuits.

According to the method and the device of the present invention, interface with hardware can be defined using an interface definition language which is partially common to a software object. This allows uniform treatment of software and hardware, thus enabling ready exchanges between a software object and a hardware object, or a device. As a result, the burden on a programmer can be significantly reduced.

Further, because a method for interfacing with a software can be more easily defined, the burden on a hardware designer can also be remarkably reduced.

Still further, because hardware and software can be developed in parallel, the time required for development can be shortened.

Yet further, because connection between hardware objects and with a CPU can be easily exchanged, hardware processing and software processing can be easily substituted.

What is claimed is:

1. An interface method for a logical circuit comprising a logical operation element, comprising:
defining a hardware interface, using a first interface definition language which is partly common to a second interface definition language directed to a software object, wherein the first interface definition language has means for defining a plurality of functions, each function having a function name, and a function return value, and at least one function having at least one function argument;
providing at least a function identifying register for identifying the function name defined by the first interface definition language for a server interface circuit in order to realize the interface among the function identifying register for identifying the function name defined by the first interface definition language, an input/output register for storing the argument, and a return value register for storing the return value;
determining whether the function is the at least one function having the at least one function argument; and
performing at least one of inputting the function argument, outputting the function argument and outputting the function return value, the function return value being generated by a random number generator,
wherein the software object is capable of realizing the hardware interface independently of the server interface circuit by using only the second interface definition language.

2. An interface method for a logical circuit comprising a logical operation element, comprising:
defining a hardware interface, using a first interface definition language which is partly common to a second interface definition language directed to a software object, wherein the first interface definition language has means for defining a plurality of functions, each function having a function name and a function return value, and at least one function having at least one function argument;
providing at least a function identifying register for identifying the function name defined by the first interface definition language for a client interface circuit in order to realize the interface among the function identifying register for identifying the function name defined by the first interface definition language, an input/output register for storing the argument, and a return value register for storing the return value;
determining whether the function is the at least one function having the at least one function argument; and
performing at least one of inputting the function argument, outputting the function argument and outputting the function return value, the function return value being generated by a random number generator.
wherein the software object is capable of realizing the hardware interface independently of a server interface circuit by using only the second interface definition language.

3. An interface method for a logical circuit comprising a logical operation element, comprising:
defining a hardware interface, using a first interface definition language which is partly common to a second interface definition language directed to a software object, wherein the first interface definition language has means for defining a plurality of functions, each function having a function name and a function return value, and at least one function having at least one function argument, wherein the logical circuit comprises:
a server logical circuit, as a server interface circuit for realizing the interface, having at least a function identifying register for identifying the function name defined by the first interface definition language among the function identifying register for identifying the function name defined by the first interface definition language, means-an input/output register for storing the argument, and a return value register for storing the return value; and
a client logical circuit, as a client interface circuit for realizing the interface, having at least a function identifying register for identifying the function name defined by the first interface definition language among the function identifying register for identifying the function name defined by the first interface definition language, an input/output register for storing the argument, and a return value register for storing the return value, and
data being transferred from the function identifying register for identifying the function name of the client logical circuit to the function identifying register for identifying the function name of the server logical circuit,
the server logical circuit and the client logical circuit each having at least one of the return value registers for storing and data can be transferred between the return value register for storing the return value of the client logical circuit and the return value register for storing a return value of the server logical circuit;
determining whether the function is the at least one function having the at least one function argument; and
performing at least one of inputting the function argument, outputting the function argument and outputting the function return value, the function return value being generated by a random number generator.
wherein the software object is capable of realizing the hardware interface directly and independently of the server logical circuit by using only the second interface definition language.

4. A device having a hardware interface and a logical circuit comprising a logical operation element, which defines the hardware interface, using a first interface definition language which is partly common to a second interface definition language directed to a software object, the first interface definition language having means for defining a plurality of functions, each function having a function name and a return value, and at least one function having at least one function argument, the device comprising:

a server interface circuit for realizing the interface, the server interface circuit comprising a function identifying register for identifying the function name defined by the first interface definition language among the function identifying register for identifying the function name defined by the first interface definition language, an input/output register for storing the argument, and a return value register for storing the return value, means for determining whether the function is the at least one function having the at least one function argument, and means for performing at least one of inputting the at least one function argument and outputting the at least one function argument, the return value being generated by a random number generator, and the software object capable of realizing the hardware interface independently of the server interface circuit by using only the second interface definition language.

5. A device having a hardware interface and a logical circuit, which defines the hardware interface, using a first interface definition language which is partly common to a second interface definition language directed to a software object such that a part of the first interface definition language and a part of the second interface definition language use the same language to specify an interface name, a function name, and an argument and a return value for each function and has means for defining a plurality of functions, each function having a function name and a function return value and at least one function having at least one fimction argument, comprising:

a client interface circuit for realizing the interface comprises function identifying register for identifying the function name defined by the first interface definition language among the function identifying register for identifying the function name defined by the first interface definition language, an input/output register for storing the argument, and a return value register for storing the return value; and an argument register for inputting the at least one function argument and for outputting the at least one function argument, wherein the software object is capable of realizing the hardware interface independently of a server interface circuit by using only the second interface definition language, and wherein the return value is generated by a random number generator.

6. The device according to claim 5, wherein the client interface circuit has a connection terminal, the connection terminal of the client interface is connected to the server interface circuit or a system bus, when the connection terminal of the client interface is connected to the server interface circuit, the device connected with the server interface circuit is drivable via the server interface circuit, and when the connection terminal of the client interface is connected to the system bus, a value of the register within the client interface can be read via a central processing device such that the central processing device can serve in the place of the device connected with the server interface circuit.

7. An interface method according to claim 3, further comprising:

the server logical circuit and the client logical circuit each having the input/output register and data being transferred between the input/output register of the server logical circuit and the input/output register of the client logical circuit.

8. An interface method for a logical circuit comprising a logical operation element, comprising:

defining a hardware interface, using an interface definition language having means for at least defining a plurality of functions, each function having a function name and a function return value, and at least one function having at least one function argument;

providing at least a function identifying register for identifying the function name defined by the interface definition language for a client interface circuit in order to realize the interface among the function identifying register for identifying the function name defined by the interface definition language, an input/output register for storing the argument, and a return value register for storing the return value;

determining whether the function is the at least one function having the at least one function argument; and performing at least one of inputting the function argument, outputting the function argument and outputting the function return value, the function return value being generated by a random number generator.

wherein the client interface circuit is capable of realizing the hardware interface independently of a server interface circuit by using another interface definition language.

9. An interface method for a logical circuit comprising a logical operation element, comprising:

defining a hardware interface, using an interface definition language having means for defining a plurality of functions, each function having a function name and a return value, and at least one function having at least one argument, wherein the logical circuit comprises:

a server logical circuit, as a server interface circuit for realizing the interface, having at least a function identifying register for identifying the function name defined by the interface definition language among the function identifying register identifying the function name defined by the interface definition language, an input/output register for storing the argument, and a return value register for outputting the return value, and a client logical circuit, as a client interface circuit for realizing the interface, having at least a function identifying register for identifying the function name defined by the interface definition language among the function identifying register for identifying the function name defined by the interface definition language, an input/output register for storing the argument, and a return value register for storing the return value, and data being transferred from the function identifying register of the client logical circuit to the function identifying register of the server logical circuit, the server logical circuit and the client logical circuit each having at least one of the return value registers, and data can be transferred between the return value register of the client logical circuit to the return value register of the server logical circuit;

determining whether or not the function has the at least one function argument; and performing at least one of inputting the function argument, outputting the function argument and outputting the function return value, the function return value being generated by a random number generator, wherein the client logical circuit is capable of realizing the hardware interface independently of the server interface circuit by using another interface definition language.

10. A device having a hardware interface and a logical circuit comprising a logical operation element, which defines the hardware interface, using an interface definition language having means for defining a function name, an argument, and a return value for each function defined by the function name, the device comprising:

a server interface circuit for realizing the interface, the server interface circuit comprising:

a function identifying register for identifying the function name defined by the interface definition language among the function identifying register for identifying the function name defined by the interface definition language, an input/output register for storing the argument, and a return value register for storing the return value the return value being generated by a random number generator; and an argument number detection section for determining whether the function is the at least one function having the at least one function argument, and a client interface circuit capable of realizing the interface independently of the server interface circuit by using another interface definition language.

11. A device having a hardware interface and a logical circuit, which defines the hardware interface, using an interface definition language having means for defining a plurality of functions, each function having a function name and a function return value, and at least one function having at least one function argument, the device comprising:

a client interface circuit for realizing the interface, the client interface circuit comprising a function identifying register for identifying the function name defined by the interface definition language among the function identifying register for identifying the function name defined by the interface definition language, an input/output register for storing the argument, and a return value register for storing the return value, means for determining whether the function is the at least one function having the at least one function argument, and means for performing at least one of inputting the at least one function argument and outputting the at least one function argument, the client interface circuit is capable of realizing the interface independently of a server interface circuit by using another interface definition language, and the return value being generated by a random number generator.

12. The device according to claim 11, wherein the client interface circuit has a connection terminal, the connection terminal of the client interface is connected to the server interface circuit or a system bus, when the connection terminal of the client interface is connected to the server interface circuit, the device connected with the server interface circuit is drivable via the server interface circuit, and when the connection terminal of the client interface is connected to the system bus, a value of the register within the client interface is capable of reading via a central processing device such that the central processing device is capable of serving in the place of the device connected with the server interface circuit.

13. An interface method according to claim 9, further comprising:

the server logical circuit and the client logical circuit each having the input/output register and data being transferred between the input/output register of the server logical circuit and the input/output register of the client logical circuit.

* * * * *